United States Patent
P et al.

(10) Patent No.: US 9,419,613 B2
(45) Date of Patent: Aug. 16, 2016

(54) LOW POWER SCHEME TO PROTECT THE LOW VOLTAGE CAPACITORS IN HIGH VOLTAGE IO CIRCUITS

(71) Applicant: Texas Instruments Incorporated, Dallas, TX (US)

(72) Inventors: Venkateswara Reddy P, Bangalore (IN); Vinayak Ghatawade, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 65 days.

(21) Appl. No.: 14/490,110

(22) Filed: Sep. 18, 2014

(65) Prior Publication Data
US 2015/0130527 A1     May 14, 2015

Related U.S. Application Data

(60) Provisional application No. 61/902,994, filed on Nov. 12, 2013.

(51) Int. Cl.
| H03K 3/00 | (2006.01) |
| H03K 19/00 | (2006.01) |
| H03K 19/0185 | (2006.01) |
| H03K 19/003 | (2006.01) |

(52) U.S. Cl.
CPC ...... *H03K 19/0013* (2013.01); *H03K 19/00361* (2013.01); *H03K 19/018521* (2013.01); *H03K 19/018592* (2013.01)

(58) Field of Classification Search
None
See application file for complete search history.

(56) References Cited

U.S. PATENT DOCUMENTS

| 7,019,551 B1* | 3/2006 | Biesterfeldt | H03K 17/163 326/27 |
| 7,429,873 B2* | 9/2008 | Peschke | H03K 17/102 326/81 |
| 2006/0145734 A1* | 7/2006 | Abdel-Hamid | H03K 19/00384 327/112 |
| 2008/0231340 A1* | 9/2008 | Shiraki | H01L 27/0251 327/333 |
| 2010/0231267 A1* | 9/2010 | Scott | H03K 19/018507 327/108 |
| 2011/0031944 A1* | 2/2011 | Stirk | H02J 7/0021 323/234 |
| 2013/0141140 A1* | 6/2013 | Kumar | G11C 7/1057 327/108 |
| 2014/0009214 A1* | 1/2014 | Altunkilic | H03K 17/161 327/427 |
| 2014/0062570 A1* | 3/2014 | Yu | H03L 5/00 327/333 |
| 2015/0130511 A1* | 5/2015 | P | H03K 19/017509 326/88 |
| 2015/0130527 A1* | 5/2015 | P | H03K 19/0013 327/310 |

* cited by examiner

*Primary Examiner* — Lincoln Donovan
*Assistant Examiner* — Khareem E Almo
(74) *Attorney, Agent, or Firm* — John R. Pessetto; Frank D. Cimino

(57) ABSTRACT

An input/output (IO) circuit includes a first bias circuit and a second bias circuit coupled to a node. A first capacitor and a second capacitor are being cascaded and coupled to the node. The node is defined between the first capacitor and the second capacitor. A pad is coupled to the node. The first bias circuit maintains a voltage at the node below a threshold during a transmit mode and a receive mode of the IO circuit and the second bias circuit maintains the voltage at the node below the threshold during the receive mode. The voltage at the node is dependent on a voltage at the pad during the receive mode.

18 Claims, 5 Drawing Sheets

LOW POWER SCHEME TO PROTECT THE LOW VOLTAGE CAPACITORS IN HIGH VOLTAGE IO CIRCUITS

CROSS REFERENCES TO RELATED APPLICATIONS

This application claims priority from U.S. provisional patent application No. 61/902,994 filed on Nov. 12, 2013, which is hereby incorporated by reference in its entirety.

TECHNICAL FIELD

Embodiments of the disclosure relate generally to integrated circuits (ICs) and more particularly to an input/output (IO) circuit in ICs.

BACKGROUND

An integrated circuit (IC) includes core logic and input/output (IO) circuits. The core logic performs a desired function and requires a low voltage termed as core supply voltage. The IC communicates with other ICs or external devices (filters, sensors etc.) at high voltage range termed as the IO supply voltage. The IO circuits act as an interface and communicate data between the core logic and the external devices. The IO circuits are connected to the external devices through board traces or metal wires, called transmission lines. An IO circuit includes a driver that drives signals on a pad to interface with the external devices. A bidirectional IO circuit has a driver used for sending signals to the external devices (transmit mode) and a receiver for receiving signals from the external devices (receive mode).

The IO circuits need to generate output signals to drive the external devices with suitable voltage levels compatible with the specifications of the external devices to ensure that the data is accurately transferred to the external devices. For example, if an external device is designed to receive input signals at +5 Volts, then output signals need to be at a maximum voltage of +5V. The IO circuits are generally implemented using low voltage transistors. In general, using low voltage transistors provides benefits such as high throughput performance, reduced electrical power consumption, lower number of fabrication masks (leading to lower fabrication costs) and high density (number of integrated circuits in a unit area).

A slew rate is a maximum rate of change of a signal at any point in the IC. The output voltage slew rate of the IO circuit is determined by the following factors, but not limited to, strength of the driver, operating conditions of the IO circuit, the parasitic capacitors and the loading capacitors in the IO circuit. A typical IO circuit is a series of inverters, which drive one another. The output slew rate of an inverter is proportional to the input slew rate. Thus, for high performance ICs, IO circuits with high driver strength are required. This increases the slew rate and thereby the supply current variations which cause the supply drop thus impacting the performance of the IO circuit. The control of slew rate of I/O circuit output voltage is very important as it is a major contributor to noise on the supply and ground lines. A fast rate of change of output voltage also affects electromagnetic interference ("EMI"), as well as signal reflection while driving a long cable, creating signal integrity problems in high speed serial data communication. Accordingly, it is desirable to implement the IO circuit generating high voltage output signals using low voltage devices and having slew rate control mechanism.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an input/output (IO) circuit. The IO circuit includes a first bias circuit and a second bias circuit coupled to a node. A first capacitor and a second capacitor are being cascaded and coupled to the node. The node is defined between the first capacitor and the second capacitor. A pad is coupled to the node. The first bias circuit maintains a voltage at the node below a threshold during a transmit mode and a receive mode of the IO circuit and the second bias circuit maintains the voltage at the node below the threshold during the receive mode. The voltage at the node is dependent on a voltage at the pad during the receive mode.

Another embodiment provides a method of protecting low voltage devices in an IO (input/output) circuit. A first capacitor and a second capacitor being cascaded in the IO (input/output) circuit. The first capacitor and the second capacitor are coupled to a node. The node is being defined between the first capacitor and the second capacitor. A first bias circuit maintains a voltage at the node below a threshold during a transmit mode and a receive mode of the IO circuit. A second bias circuit maintains the voltage at the node below the threshold during the receive mode.

Yet another embodiment provides a computing device. The computing device includes a processing unit, a memory module coupled to the processing unit and a plurality of logic circuits coupled to the processing unit and the memory module. An input/output (IO) circuit is coupled to at least one logic circuit. The IO circuit includes a first bias circuit and a second bias circuit coupled to a node. A first capacitor and a second capacitor are being cascaded and coupled to the node. The node is defined between the first capacitor and the second capacitor. A pad is coupled to the node. The first bias circuit maintains a voltage at the node below a threshold during a transmit mode and a receive mode of the IO circuit and the second bias circuit maintains the voltage at the node below the threshold during the receive mode. The voltage at the node is dependent on a voltage at the pad during the receive mode.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
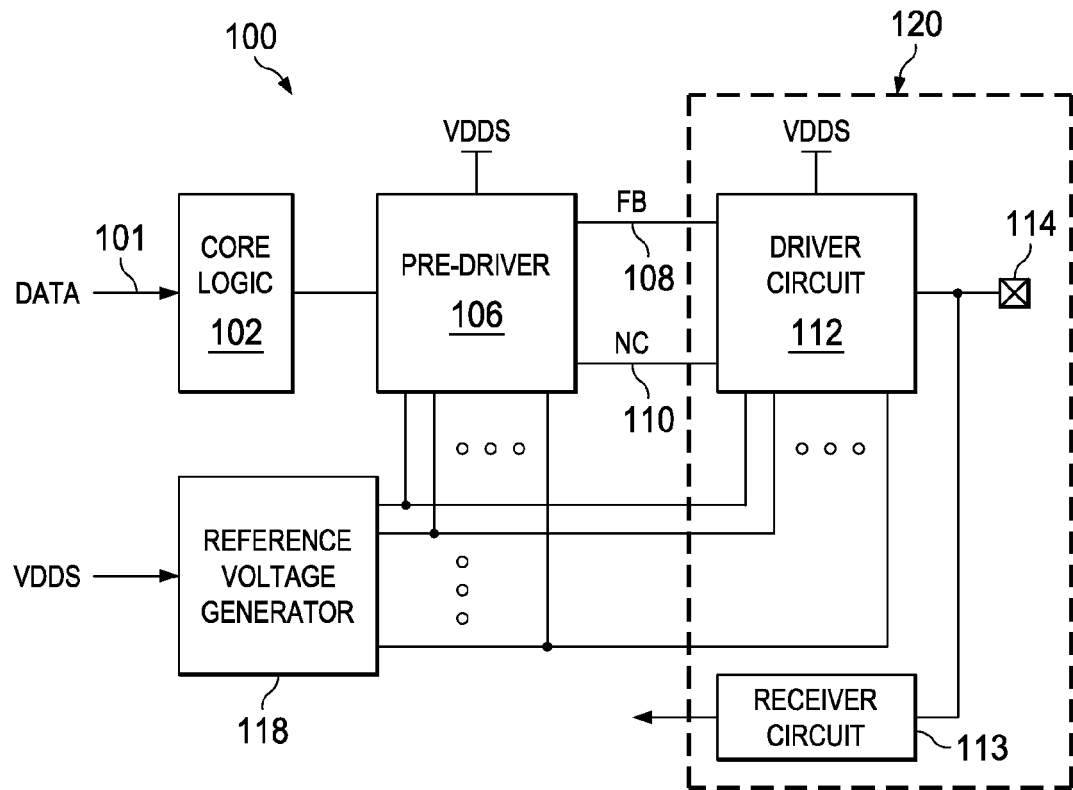
FIG. 1 illustrates a block diagram of an example environment of an integrated circuit (IC) in which several aspects of the present disclosure may be implemented.

FIG. 1 illustrates a block diagram of an example environment of an integrated circuit (IC) 100 in which several aspects of the present disclosure may be implemented. The IC 100 includes a core logic 102 that is configured to receive a data 101. The core logic 102 is coupled to the pre-driver 106. The pre-driver 106 generates a first output (FB) 108 and a second output (NC) 110. The pre-driver 106 is configured to provide the first output (FB) 108 and the second output (NC) 110 to an input/output (IO) circuit 120. The IO circuit 120 includes a driver circuit 112, a receiver circuit 113 and a pad 114. The driver circuit 112 is coupled to the pad 114. The receiver circuit 113 is coupled to the driver circuit 112 and the pad 114. The driver circuit 112 receives the first output (FB) 108 and the second output (NC) 110. The IC 100 includes a reference voltage generator 118 that receives a supply voltage VDDS. The reference voltage generator generates a set of reference voltages. The set of reference voltages include one of a PMOS reference voltage (Vrefp), an NMOS reference voltage (Vrefn) and a divided supply voltage (Vrefd). The set of reference voltages are supplied to the pre-driver 106 and the driver circuit 112. The pre-driver 106 and the driver circuit 112 also receive the supply voltage VDDS. The integrated circuit 100 may include one or more additional components known to those skilled in the relevant art and are not discussed here for simplicity of the description.

The operation of the circuit on integrated circuit 100 illustrated in FIG. 1 is explained now. The core logic 102 performs various operations on the data 101 and provides the resulting data to the pre-driver 106. The pre-driver 106 receives the data from the core logic 102 and generates the first output (FB) 108 and the second output (NC) 110. The pre-driver 106 also inverts the data received from the core logic 102 without altering the data in the signals. The driver circuit 112 is used for sending signals to an external device (transmit mode) and a receiver circuit 113 is used for receiving signals from the external device (receive mode). Generally, the driver circuit 112 is tri-stated during the receive mode. The driver circuit 112 generates an output signal with a voltage level equaling the specifications of an external device. The output signal is generated based on the first output (FB) 108 and the second output (NC) 110 received from the pre-driver 106. The output signal is provided through the pad 114 to the external device.

Figure 2:
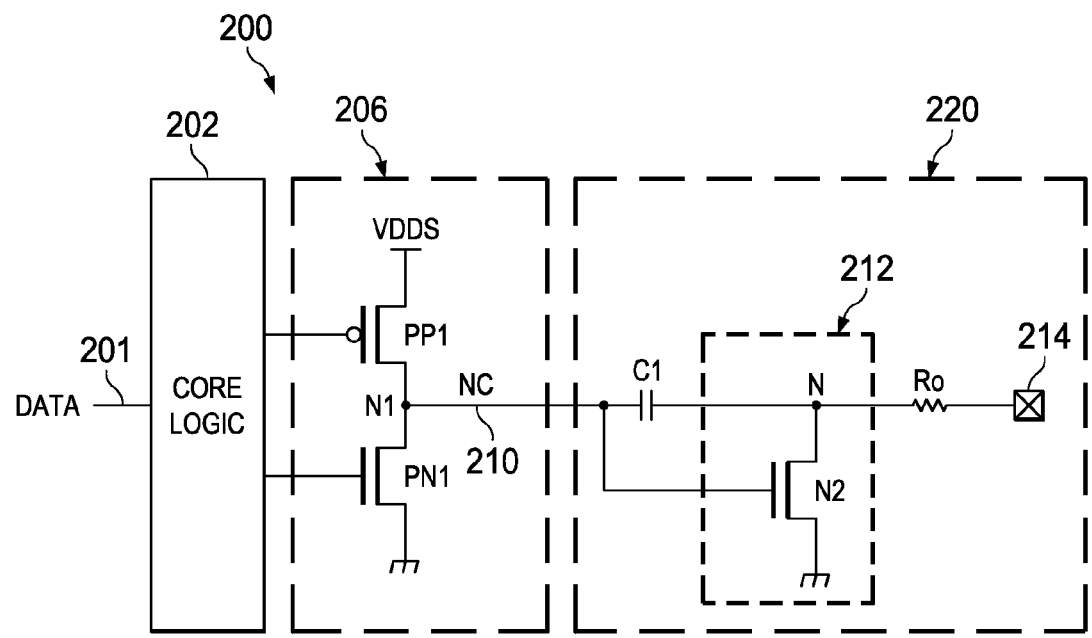
FIG. 2 illustrates a circuit schematic of a pre-driver and an input/output (IO) circuit in the integrated circuit.

FIG. 2 illustrates a circuit schematic of a pre-driver and an input/output (IO) circuit in an integrated circuit 200. The IC 200 is a circuit schematic of the block diagram of the IC 100 illustrated in FIG. 1. It is to be noted that the IC 100 may be implemented in other ways using other circuit components and IC 200 is one of the many ways of implementing IC 100. The IC 200 includes a core logic 202 that is configured to receive a data 201. The core logic 202 is coupled to the pre-driver 206. The pre-driver 206 generates an output (NC) 210. The pre-driver 206 includes a first PMOS transistor PP1 and a first NMOS transistor PN1. The first PMOS transistor PP1 and the first NMOS transistor PN1 receive a data from the core logic 202. A gate terminal of the first PMOS transistor PP1 and a gate terminal of the first NMOS transistor PN1 receive the data from the core logic 202. A source terminal of the first PMOS transistor PP1 receives a supply voltage VDDS. A drain terminal of the first PMOS transistor PP1 is coupled to a drain terminal of the first NMOS transistor PN1 to have a common node N1. The output (NC) 210 is generated at the common node N1 of the first PMOS transistor PP1 and the first NMOS transistor PN1. The pre-driver 206 is configured to provide the output (NC) 210 to an input/output (IO) circuit 220.

The IO circuit 220 includes a first capacitor C1, a driver circuit 212, a resistor Ro and a pad 214. The IO circuit 220 also includes a receiver (not illustrated in FIG. 2) similar to the receiver circuit 113 illustrated in FIG. 1, coupled to the pad 214. The common node N1 of the pre-driver 206 is coupled to the first capacitor C1. The first capacitor C1 receives the output (NC) 210 from the pre-driver 206. A driver circuit 212 is coupled to the first capacitor C1. The driver circuit 212 includes a second NMOS transistor N2. A drain terminal of the second NMOS transistor N2 and the first capacitor C1 are coupled to a node N. A gate terminal of the second NMOS transistor N2 is coupled to the common node N1 and receives the output NC 210 from the pre-driver 206. A source terminal of the first NMOS transistor PN1 and a source terminal of the second NMOS transistor N2 are coupled to a ground terminal. A resistor Ro is coupled to the driver circuit 212 and the first capacitor C1 through the node N. A pad 214 is coupled to the resistor Ro. The capacitor and the transistors used in the IO circuit 220 have high voltage tolerance of the order of supply voltage VDDS.

The operation of the pre-driver 206 and the IO circuit 220 in the IC 200 illustrated in FIG. 2 is explained now. The core logic 202 performs various operations on the data 201 and provides the resulting data to the pre-driver 206. The pre-driver 206 receives the data from the core logic 202 and generates the output (NC) 210. The pre-driver 206 also inverts the data received from the core logic 202 without altering the data in the signals. The IO circuit 220 generates an output signal with a voltage level equaling the specifications of an external device. The output signal is generated based on the output (NC) 210 received from the pre-driver 206. The output signal is provided through the pad 214 to the external device. The first capacitor C1 controls a slew rate of the output signal of the IO circuit 220. In transmit mode, the common node N1 and node N are of opposite polarity i.e. when a signal at node N1 rises, a signal at node N falls and vice versa. The first capacitor C1 couples the transition at common node N1 to the node N. When the signal at the common node N1 starts rising at a faster rate, the signal at node N or at the pad 214 starts falling at a similar rate. However, the first capacitor C1 couples this fall in the signal at the pad 214 to the common node N1 thus reducing the rising rate of the signal at the common node N1. This reduces the falling rate of the signal at node N. The coupling by the first capacitor C1 is proportional to a rate of change of voltage across the first capacitor C1 and to the size of the first capacitor C1. Generally, the size of first capacitor C1 is very large and is of the order of pico-farads. Hence, the first capacitor C1 is large enough to couple the slew rate of the pad 214 to the common node N1. A high slew rate at the pad 214 causes a high slew rate at the common node N1 which is coupled to the pad 214 by the first capacitor C1 thus controlling the slew rate at the pad 214. However, in a receive mode, when the driver circuit 212 is in tristate mode and the common node N1 is at logic-LOW, the large size of the first capacitor C1 acts as a load on the pad 214 which impacts the performance and increases the power requirement of the IC 200.

Figure 3:
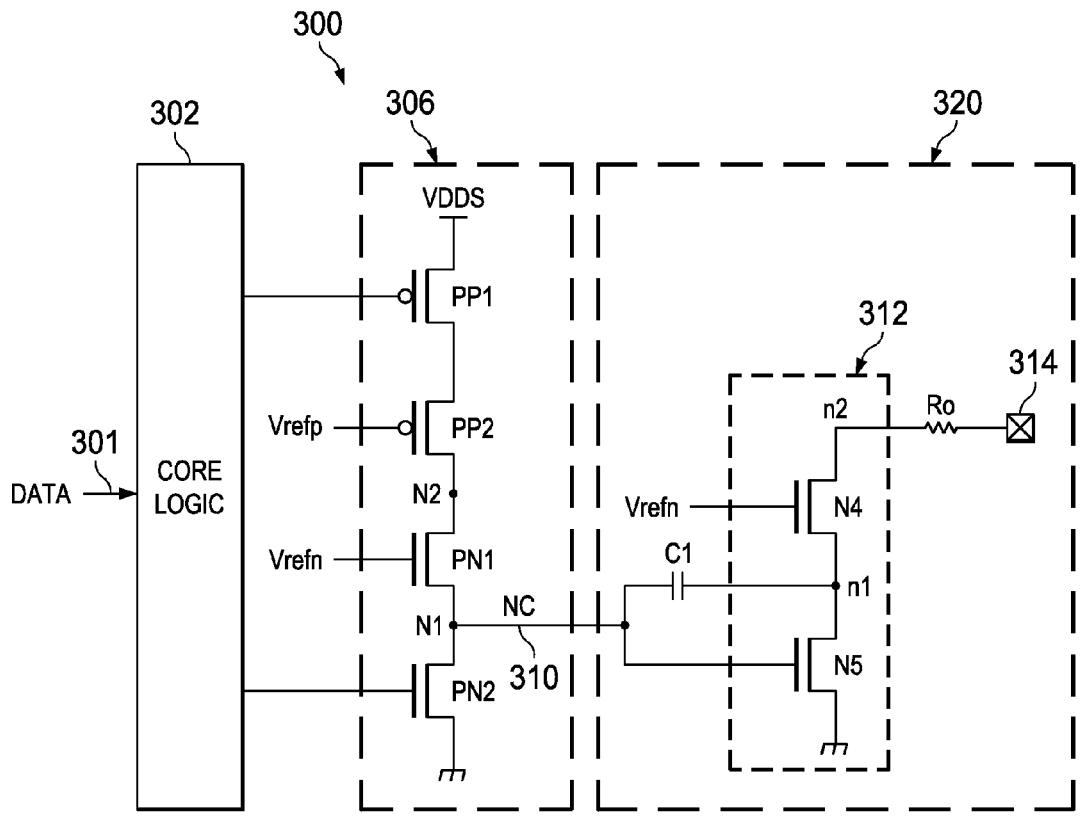
FIG. 3 illustrates a circuit schematic of a pre-driver and an input/output (IO) circuit in the integrated circuit.

FIG. 3 illustrates a circuit schematic of a pre-driver and an input/output (IO) circuit in an integrated circuit 300. The IC 300 is a circuit schematic of the block diagram of the IC 100 illustrated in FIG. 1. It is to be noted that the IC 100 may be implemented in other ways using other circuit components and IC 300 is one of the many ways of implementing IC 100. The IC 300 includes a core logic 302 that is configured to receive a data 301. The core logic 302 is coupled to the pre-driver 306. The pre-driver 306 generates an output (NC) 310. The pre-driver 306 includes a first PMOS transistor PP1, a second PMOS transistor PP2, a first NMOS transistor PN1 and a second NMOS transistor PN2. The first PMOS transistor PP1 and the second NMOS transistor PN2 receive a data from the core logic 302. A gate terminal of the first PMOS transistor PP1 and a gate terminal of the second NMOS transistor PN2 receive the data from the core logic 302. A source terminal of the first PMOS transistor PP1 receives a supply voltage VDDS. A drain terminal of the first PMOS transistor PP1 is coupled to a source terminal of the second PMOS transistor PP2. The second PMOS transistor PP2 receives a PMOS reference voltage (Vrefp) and the first NMOS transistor PN1 receives an NMOS reference voltage (Vrefn). A gate terminal of the second PMOS transistor PP2 receives the PMOS reference voltage (Vrefp) and a gate terminal of the first NMOS transistor PN1 receives the NMOS reference voltage (Vrefn). A drain terminal of the second PMOS transistor PP2 and a drain terminal of the first NMOS transistor PN1 are coupled to a node N2. A source terminal of the first NMOS transistor PN1 and a drain terminal of the second NMOS transistor PN2 are coupled to have a common node N1. A source terminal of the second NMOS transistor PN2 is coupled to a ground terminal. The output (NC) 310 is generated at the common node N1 of the first NMOS transistor PN1 and the second NMOS transistor PN2. The pre-driver 306 is configured to provide the output (NC) 310 to an input/output (IO) circuit 320.

The IO circuit 320 includes a first capacitor C1, a driver circuit 312, a resistor Ro and a pad 314. The common node N1 of the pre-driver 306 is coupled to the first capacitor C1. The first capacitor C1 receives the output (NC) 310 from the pre-driver 306. A driver circuit 312 is coupled to the first capacitor C1. The driver circuit 312 includes a fourth NMOS transistor N4 and a fifth NMOS transistor N5. A source terminal of the fourth NMOS transistor N4 and a drain terminal of the fifth NMOS transistor N5 are coupled to a common node n1. The first capacitor C1 is coupled between a gate terminal and the drain terminal of the fifth NMOS transistor N5. A gate terminal of the fourth NMOS transistor N4 receives the NMOS reference voltage (Vrefn). A gate terminal of the fifth NMOS transistor N5 is coupled to the node N1 and receives the output (NC) 310. A source terminal of the fifth NMOS transistor N5 is coupled to a ground terminal. A resistor Ro and a drain terminal of the fourth NMOS transistor N4 are coupled to node n2. A pad 314 is coupled to the resistor Ro. A reference voltage generator (not illustrated in FIG. 3) which is similar in connection and operation to reference voltage generator 118 (illustrated in FIG. 1) receives a supply voltage VDDS and generates a set of reference voltages. The set of reference voltages include at least one of the PMOS reference voltage (Vrefp), the NMOS reference voltage (Vrefn) and a divided supply voltage (Vrefd). The integrated circuit 300 may include one or more additional components known to those skilled in the relevant art and are not discussed here for simplicity of the description.

The operation of the pre-driver 306 and the IO circuit 320 in the IC 300, illustrated in FIG. 3 is explained now. The core logic 302 performs various operations on the data 301 and provides the resulting data to the pre-driver 306. The pre-driver 306 receives the data from the core logic 302 and generates the output (NC) 310. A maximum voltage level of the output (NC) 310 is less than VDDS. The pre-driver 306 also inverts the data received from the core logic 302 without altering the data in the signals. The IO circuit 320 generates an output signal with a voltage level equaling the specifications of an external device. The output signal is generated based on the output (NC) 310 received from the pre-driver 306. The output signal is provided through the pad 314 to the external device. When an output of the core logic 302 transitions from logic-LOW to logic-HIGH, a voltage at node N2 swings from 0 volt to VDDS. This causes voltage at common node N1 to swing from 0 volt to (Vrefn−Vtn), where Vtn is a threshold voltage of the first NMOS transistor PN1. Also, a voltage at node n1 swings from 0 volt to (Vrefn−Vtn). The first capacitor C1 between common node N1 and common node n1 is used to control the slew rate of the output signal of the IO circuit 320 because of the low voltage swing (0 volt to (Vrefn−Vtn)) at these nodes. However, because of the low voltage swing, the size of the first capacitor C1 is very large (approx. four times as compared to first capacitor C1 in IO circuit 220). Also, a low voltage capacitor for slew rate control cannot be used between node N2 and node n2 because high voltage swings at these nodes (0 volt to VDDS) can damage the low voltage capacitor. In a receive mode, when the driver circuit 312 is in tristate mode and the common node N1 is at logic-LOW, the large size of the first capacitor C1 acts as a load on the pad 314 which impacts the performance and the power requirement of the IC 300.

Figure 4:
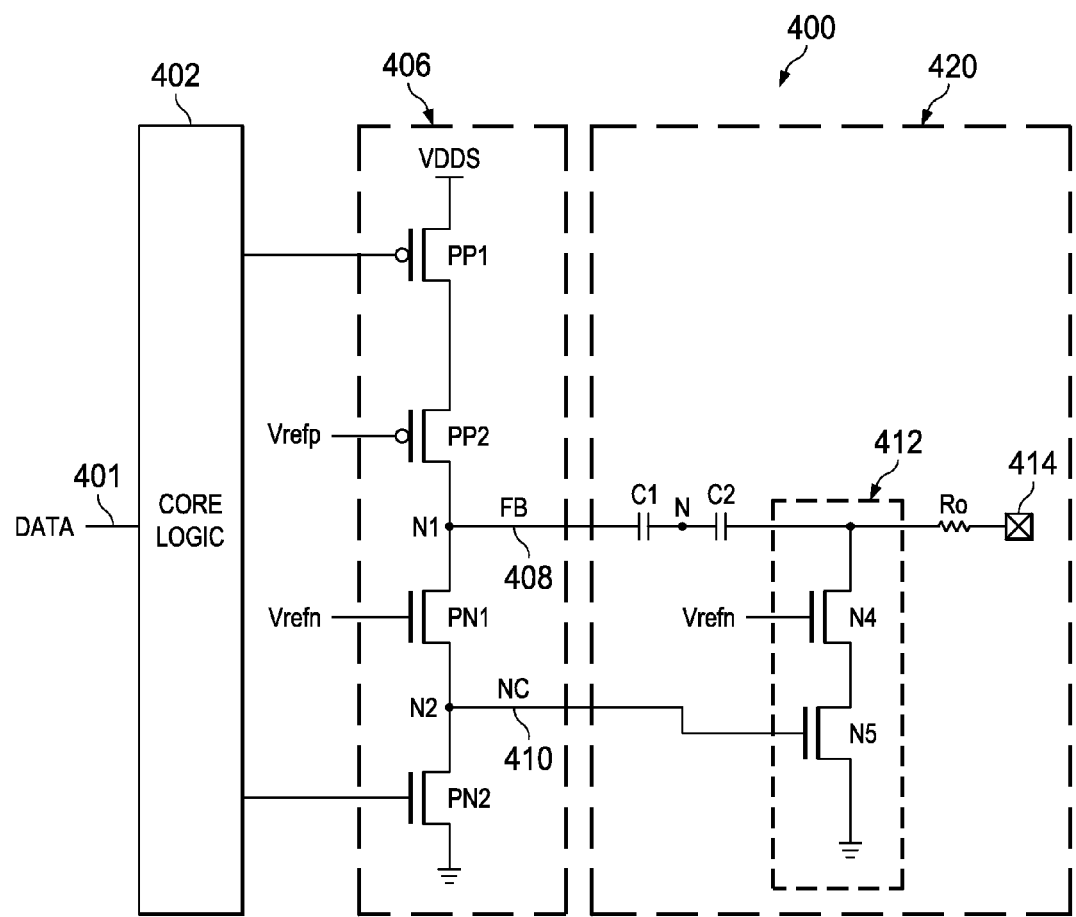
FIG. 4 illustrates a circuit schematic of a pre-driver and an input/output (IO) circuit in the integrated circuit.

FIG. 4 illustrates a circuit schematic of a pre-driver and an input/output (IO) circuit in an integrated circuit 400. The IC 400 is a circuit schematic of the block diagram of the IC 100 illustrated in FIG. 1. It is to be noted that the IC 100 may be implemented in other ways using other circuit components and IC 400 is one of the many ways of implementing IC 100. The IC 400 includes a core logic 402 that is configured to receive a data 401. The core logic 402 is coupled to the pre-driver 406. The pre-driver 406 generates a first output (FB) 408 and a second output (NC) 410. The pre-driver 406 includes a first PMOS transistor PP1, a second PMOS transistor PP2, a first NMOS transistor PN1 and a second NMOS transistor PN2. The first PMOS transistor PP1 and the second NMOS transistor PN2 receive a data from the core logic 402. A gate terminal of the first PMOS transistor PP1 and a gate terminal of the second NMOS transistor PN2 receive the data from the core logic 402. A source terminal of the first PMOS transistor PP1 receives a supply voltage VDDS. A drain terminal of the first PMOS transistor PP1 is coupled to a source terminal of the second PMOS transistor PP2. The second PMOS transistor PP2 receives a PMOS reference voltage (Vrefp) and the first NMOS transistor PN1 receives an NMOS reference voltage (Vrefn). A gate terminal of the second PMOS transistor PP2 receives the PMOS reference voltage (Vrefp) and a gate terminal of the first NMOS transistor PN1 receives the NMOS reference voltage (Vrefn). A drain terminal of the second PMOS transistor PP2 and a drain terminal of the first NMOS transistor PN1 are coupled to have a common node N1. The first output (FB) 408 is generated at the common node N1 of the second PMOS transistor PP2 and the first NMOS transistor PN1. A source terminal of the first NMOS transistor PN1 and a drain terminal of the second NMOS transistor PN2 are coupled to have a common node N2. A source terminal of the second NMOS transistor PN2 is coupled to a ground terminal. The second output (NC) 410 is generated at the common node N2 of the first NMOS transistor PN1 and the second NMOS transistor PN2. The pre-driver 406 is configured to provide the first output (FB) 408 and the second output (NC) 410 to an input/output (IO) circuit 420.

The IO circuit 420 includes a first capacitor C1, a second capacitor C2, a driver circuit 412, a resistor Ro and a pad 414. The common node N1 of the pre-driver 406 is coupled to the first capacitor C1. The first capacitor C1 receives a first output (FB) 408 from the pre-driver 406. The first capacitor C1 is coupled to the second capacitor C2. The first capacitor C1 and the second capacitor C2 are coupled to a node N which is being defined between the first capacitor C1 and the second capacitor C2. The first capacitor C1 and the second capacitor C2 are arranged in a cascade arrangement. A driver circuit 412 is coupled to the second capacitor C2. The driver circuit 412 includes a fourth NMOS transistor N4 and a fifth NMOS transistor N5. A drain terminal of the fourth NMOS transistor N4 is coupled to the second capacitor C2. A source terminal of the fourth NMOS transistor N4 is coupled to a drain terminal of the fifth NMOS transistor N5. The fourth NMOS transistor N4 receives the NMOS reference voltage (Vrefn) at a gate terminal. The fifth NMOS transistor N5 is coupled to the node N2 and receives the second output (NC) 410 at a gate terminal of the fifth NMOS transistor N5. A source terminal of the fifth NMOS transistor N5 is coupled to the ground terminal. A resistor Ro is coupled to the driver circuit 412 and the second capacitor C2. A pad 414 is coupled to the resistor Ro. The driver circuit 412 may include a third PMOS transistor that receives the supply voltage VDDS at a source terminal and an output of the pre-driver 406 at a gate terminal. A drain terminal of the third PMOS transistor is coupled to a source terminal of a fourth PMOS transistor. The fourth PMOS transistor receives a PMOS reference voltage (Vrefp) at a gate terminal. A drain terminal of the fourth PMOS transistor is coupled to a drain terminal of the fourth NMOS transistor N2.

A reference voltage generator (not illustrated in FIG. 4) which is similar in connection and operation to reference voltage generator 118 (illustrated in FIG. 1) receives a supply voltage VDDS and generates a set of reference voltages. The set of reference voltages include one of a PMOS reference voltage (Vrefp), an NMOS reference voltage (Vrefn) and a divided supply voltage (Vrefd). The integrated circuit 400 may include one or more additional components known to those skilled in the relevant art and are not discussed here for simplicity of the description.

The operation of the pre-driver 406 and the IO circuit 420 on the IC 400 illustrated in FIG. 4 is explained now. The core logic 402 performs various operations on the data 401 and provides the resulting data to the pre-driver 406. The pre-driver 406 receives the data from the core logic 402 and generates the first output (FB) 408 and the second output (NC) 410. The first output (FB) 408 and the second output (NC) 410 have a same polarity but different voltage swings. A maximum voltage level of the first output (FB) 408 is VDDS and a maximum voltage level of the second output (NC) 410 is less than VDDS. The pre-driver 406 also inverts the data received from the core logic 402 without altering the data in the signals. The IO circuit 420 generates an output signal with a voltage level equaling the specifications of an external device. The output signal is generated based on the first output (FB) 408 and the second output (NC) 410 received from the pre-driver 406. The output signal is provided through the pad 414 to the external device. The first capacitor C1 and the second capacitor C2 are used to control a slew rate of the output signal of the IO circuit 420. When the IO circuit 420 is a 3.3 volt IO circuit and the transistors and capacitors used in IO circuit 420 are low voltage device (for example 1.8 volt devices), the first capacitor C1 and the second capacitor C2 are used to accommodate the 3.3 volt range of IO circuit 420. However, the node N in between the first capacitor C1 and the second capacitor C2 is at undefined voltage level since it is not connected to a biasing circuit. If the node N is at a voltage above a voltage specification of the first capacitor C1 and the second capacitor C2, it tends to overstress the capacitors C1 and C2. When the node N biased to a voltage VDDS/2, this loads the pre-driver 406 and the driver circuit 412 which impacts the performance of IO circuit 420. In a receive mode, the first output (FB) 408 is at logic-LOW. If there is a voltage transition from logic-LOW to logic-HIGH at the pad 414, the second capacitor C2 couples the high voltage at the pad 414 to the node N. If the node N is biased to VDDS/2, the voltage across the first capacitor C1 may be beyond the specified limit. Thus, biasing node N to a voltage such as VDDS/2, does not meet the slew rate control requirements. Therefore, the node N need to be biased by a circuit that maintains the node N below a threshold during the receive mode and a transmit mode of the IO circuit. The transmit mode is when the driver circuit 412 in the IO circuit 420 is sending signals to the external device. The receive mode is when a receiver (not illustrated in the figure) in the IO circuit 420 is receiving signals from the external device. The driver 412 is tri-stated in receive mode. Also, the circuit that is used for biasing the node N should not draw a switching current since that would impact the slew rate of the output signal of the IO circuit 420. The circuit needs to maintain the node N below a threshold even when the pad rises to a high voltage which is above 3.3 volt in case of 3.3 volt IO circuit.

Figure 5:
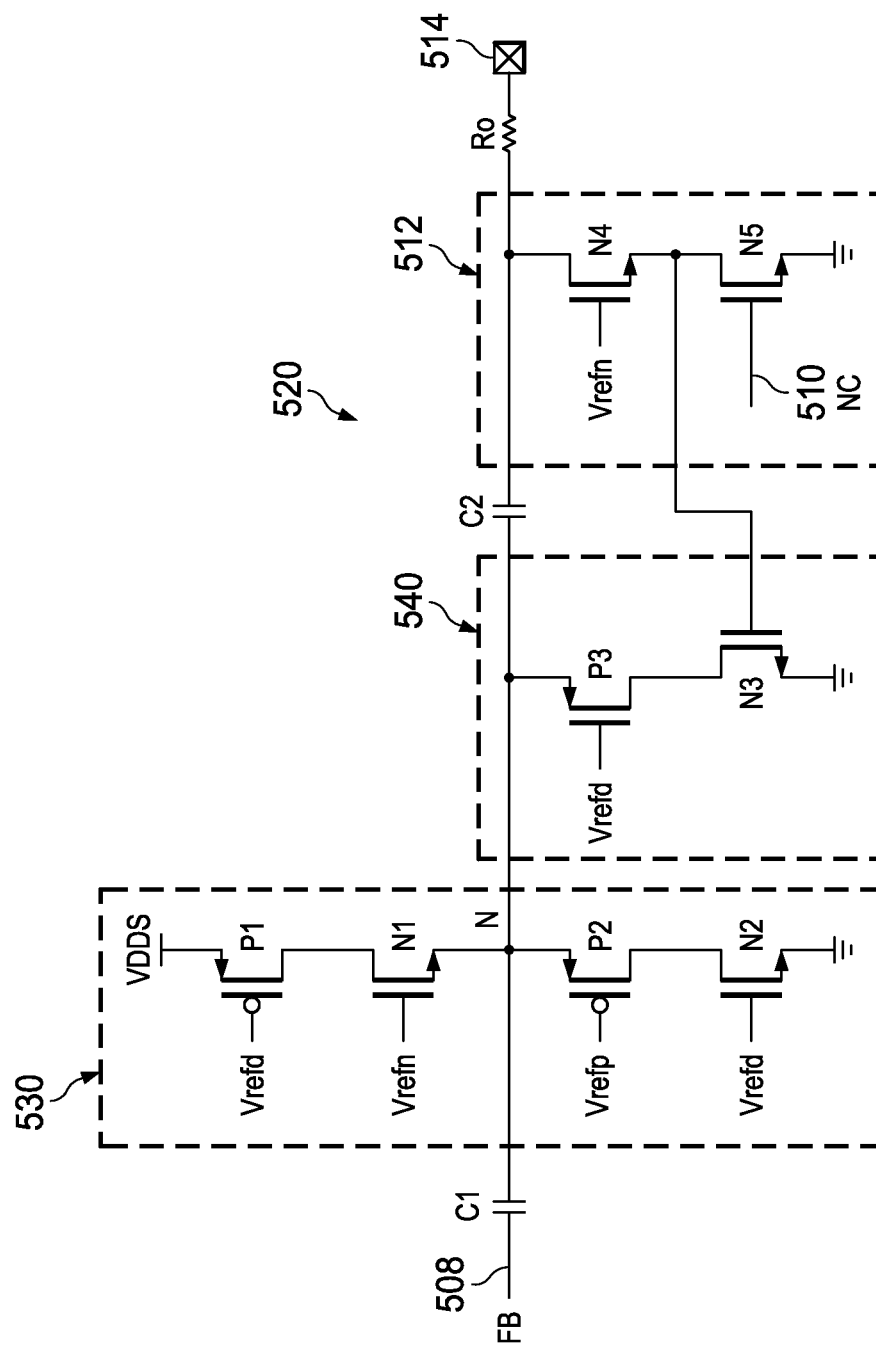
FIG. 5 illustrates a circuit schematic of an input/output (IO) circuit, according to an embodiment.

FIG. 5 illustrates a circuit schematic of an input/output (IO) circuit 520, according to an embodiment. The IO circuit 520 is implemented in the example environment of an integrated circuit (IC) 100 illustrated in FIG. 1. However, the IO circuit 520 can be implemented in other environments as well. The IO circuit 520 includes a first capacitor C1, a second capacitor C2, a first bias circuit 530, a second bias circuit 540, a driver circuit 512, a resistor Ro and a pad 514. The IO circuit also includes a reference voltage generator (not illustrated in FIG. 5) which is similar in connection and operation to reference voltage generator 118 (illustrated in FIG. 1) that receives a supply voltage VDDS and generates a set of reference voltages. The set of reference voltages include at least one of a PMOS reference voltage (Vrefp), an NMOS reference voltage (Vrefn) and a divided supply voltage (Vrefd).

The first capacitor C1 is coupled to the second capacitor C2. The first capacitor C1 and the second capacitor C2 are coupled to a node N which is being defined between the first capacitor C1 and the second capacitor C2. The first capacitor C1 and the second capacitor C2 are cascaded. The first capacitor C1 receives a first output (FB) 508 from a pre-driver (not illustrated in FIG. 5). The pre-driver is similar in connections and operations as the pre-driver 106 illustrated in FIG. 1 and generates the first output (FB) 508 and a second output (NC) 510. The first bias circuit 530 and the second bias circuit 540 are coupled to the node N. The first bias circuit 530 includes a first PMOS transistor P1, a first NMOS transistor N1, a second PMOS transistor P2 and a second NMOS transistor N2. The first PMOS transistor P1 is coupled to the first NMOS transistor N1. A drain terminal of the first PMOS transistor P1 is coupled to a drain terminal of the first NMOS transistor N1. A source terminal of the first PMOS transistor P1 receives the supply voltage VDDS. The first PMOS transistor P1 is driven by the divided supply voltage (Vrefd) and the first NMOS transistor N1 is driven by the NMOS reference voltage (Vrefn) respectively. A gate terminal of the first PMOS transistor P1 receives the divided supply voltage (Vrefd) and a gate terminal of the first NMOS transistor N1 receives the NMOS reference voltage (Vrefn) respectively. The second PMOS transistor P2 is coupled to a second NMOS transistor N2. A drain terminal of the second PMOS transistor P2 is coupled to the drain terminal of the second NMOS transistor N2. A source terminal of the second NMOS transistor N2 is coupled to a ground terminal. The second PMOS transistor P2 is driven by the PMOS reference voltage (Vrefp) and the second NMOS transistor N2 is driven by the divided supply voltage (Vrefd). A gate terminal of the second PMOS transistor P2 receives the PMOS reference voltage (Vrefp) and a gate terminal of the second NMOS transistor N2 receives the divided supply voltage (Vrefd). The first NMOS transistor N1 and the second PMOS transistor P2 are coupled to the node N. A source terminal of the first NMOS transistor N1 and a source terminal of the second PMOS transistor P2 are coupled to the node N.

The second bias circuit 540 includes a third PMOS transistor P3 and a third NMOS transistor N3. A source terminal of the third PMOS transistor P3 is coupled to the node N. The third PMOS transistor P3 is driven by the divided supply voltage (Vrefd). The third NMOS transistor N3 is coupled to the third PMOS transistor P3. A drain terminal of the third NMOS transistor N3 is coupled to a drain terminal of the third PMOS transistor P3. A driver circuit 512 is coupled to the node N. The second capacitor C2 is coupled to the node N and the driver circuit 512 is coupled to the second capacitor C2. The driver circuit 512 includes a fourth NMOS transistor N4 and a fifth NMOS transistor N5. The fourth NMOS transistor N4 is coupled to the node N. The fifth NMOS transistor N5 is coupled to the fourth NMOS transistor N4. The fourth NMOS transistor N4 is driven by the NMOS reference voltage (Vrefn). The fifth NMOS transistor N5 is driven by the second output (NC) 510 from the pre-driver (not illustrated in FIG. 5). The pre-driver is similar in connections and operations as the pre-driver 106 illustrated in FIG. 1 and generates the first output (FB) 508 and the second output (NC) 510. A gate terminal of the fourth NMOS transistor N4 receives the NMOS reference voltage (Vrefn) and a gate terminal of the fifth NMOS transistor N5 receives the second output NC 510 from the pre-driver. The fourth NMOS transistor N4 and the fifth NMOS transistor N5 have a common node of drains thereof coupled to a gate terminal of the third NMOS transistor N3. A resistor Ro is coupled to the driver circuit 512 and the second capacitor C2. A pad 514 is coupled to the resistor Ro. In one embodiment the driver circuit 512 includes a fourth PMOS transistor that receives the supply voltage VDDS at a source terminal and an output of the pre-driver at a gate terminal. A drain terminal of the fourth PMOS transistor is coupled to a source terminal of a fifth PMOS transistor. The fifth PMOS transistor receives a PMOS reference voltage (Vrefp) at a gate terminal. A drain terminal of the fifth PMOS transistor is coupled to a drain terminal of the fourth NMOS transistor N4. The IO circuit 520 may include one or more additional components known to those skilled in the relevant art and are not discussed here for simplicity of the description. The IO circuit 520 is a high voltage IO circuit and is implemented with low voltage devices i.e. each transistor and each capacitor in the IO circuit 520 has a voltage tolerance less than a supply voltage VDDS The operation of the input/output (IO) circuit 520 illustrated in FIG. 5 is explained now. The first bias circuit 530 maintains a voltage at the node N below a threshold during a transmit mode and a receive mode of the IO circuit. The second bias circuit 540 is configured to maintain the voltage at the node N below the threshold during the receive mode of the IO circuit. The voltage at the node N is dependent on a voltage at the pad 514 during the receive mode. During transmit mode, the first bias circuit 530 draws a small current such that the voltage at the node N is below the threshold. When the first output (FB) 508 and the second output (NC) 510 transitions from logic-LOW to logic-HIGH, the first capacitor C1 couples this logic transition to the node N. A first coupling current flows from the first output (FB) 508 to the node N. The logic transition in the first output (FB) 508 and the second output (NC) 510 from logic-LOW to logic-HIGH, causes a voltage at the pad 514 to fall. The second capacitor C2 couples this falling voltage at the pad 514 to the node N. A second coupling current flows from node N to the pad 514 through the second capacitor C2. With proper sizing of the first capacitor C1 and the second capacitor C2, the first coupling current is made equal to the second coupling current. Thus, a coupling current flows from the first output (FB) 508 to the pad 514. The node N does not accumulate charge since the current entering node N is equal to the current leaving node. Thus, a voltage at the node N is maintained below a threshold during a transmit mode by the first bias circuit 530. This helps to maintain the voltage across the first capacitor C1 and the second capacitor C2 within their tolerable limits, thereby reducing the reliability concerns. Also, the coupling current flowing from the first output (FB) 508 to the pad 514 maintains the slew rate of an output signal of the IO circuit 520. It is understood that the response of the IO circuit 520 will be exactly opposite when the first output (FB) 508 and the second output (NC) 510 transitions from logic-HIGH to logic-LOW.

During the receive mode, the first bias circuit 530 draws a small current such that the voltage at the node N is below the threshold. When in the receive mode and the pad 514 is above a second threshold voltage, the fourth NMOS transistor N4 gets activated. The activation of fourth NMOS transistor N4 causes the fourth NMOS transistor N4 to draw current from the pad 514 which activates the third NMOS transistor N3. Also, in the receive mode when the pad 514 is above a second threshold voltage, the voltage at the node N also rises above a first threshold voltage. This activates the third PMOS transistor P3. Thus, when the voltage at the pad 514 is above the second threshold voltage and the voltage at the node N is above the first threshold voltage, the second bias circuit 540 is activated i.e., the third PMOS transistor P3 and the third NMOS transistor N3 are activated such that a discharge path is provided to the voltage at the node. Thus, the voltage at the node N is maintained below the threshold which prevents overstress on the first capacitor C1 and the second capacitor C2 thus increasing the reliability of the IO circuit 520. The first bias circuit 530 does not draw significant current during state transitions (transitions form logic-LOW to logic-HIGH and vice versa) thus maintaining the slew rate of an output signal of the IO circuit 520. Also, the circuit does not require large capacitors as was required in IO circuit 320, thus optimizing the area used in a design using IO circuit 520. In one embodiment, when the driver circuit 512 includes the fourth PMOS transistor and the fifth PMOS transistor, the same implementation can be replicated on the PMOS side of the driver circuit 512 to control the slew rate. The operation of IO circuit 520 is further illustrated in the following example embodiment. The specifically disclosed operations and sequences of activation are provided to explain the logical flow of methods and are understood not to limit the scope of the present disclosure.

In an embodiment, for a 3.3 volt IO circuit using 1.8 volt devices (1.8 volt capacitors and 1.8 volt transistors), the node N is maintained below a threshold of 1.8 volt. In transmit mode, the first bias circuit 530 draws very small current such that the voltage at the node N is below the threshold of 1.8 volt. This 1.8 volt at node N does not overstress the first capacitor C1 and the second capacitor C2 thus increasing the reliability of the IO circuit 520. Also, the voltage at the node N does not change when the first output (FB) 508 and the second output (NC) 510 transitions from logic-LOW to logic-HIGH or from logic-HIGH to logic-LOW. In the receive mode, the second output (NC) 510 is maintained at logic-LOW to keep the driver circuit 512 in tristate mode. When the voltage at the pad 514 rises above a second threshold voltage (driven by an external device) the fourth NMOS transistor N4 is activated when the voltage at the pad 514 is above 0 volt. The fourth NMOS transistor N4 draws current from the pad 514 which activates the third NMOS transistor N3 when the voltage at the gate terminal of the third NMOS transistor N3 is above a threshold voltage. Also, in the receive mode when the voltage at the pad 514 is above the second threshold voltage, this voltage gets coupled to the node N through the second capacitor C2. When the voltage at the node N is above a first threshold voltage (for example 2 volt), the third PMOS transistor P3 gets activated. Thus, when the voltage at the node N is above the first threshold voltage and the voltage at the pad is above the second threshold voltage, the third PMOS transistor P3 and the third NMOS transistor N3 are activated such that a discharge path is provided to the voltage at the node. Thus, the voltage at the node N is maintained below the threshold of 1.8 volt. The specifically disclosed operations and sequences of activation are provided to explain the logical flow of methods and are understood not to limit the scope of the present disclosure.

Figure 6:
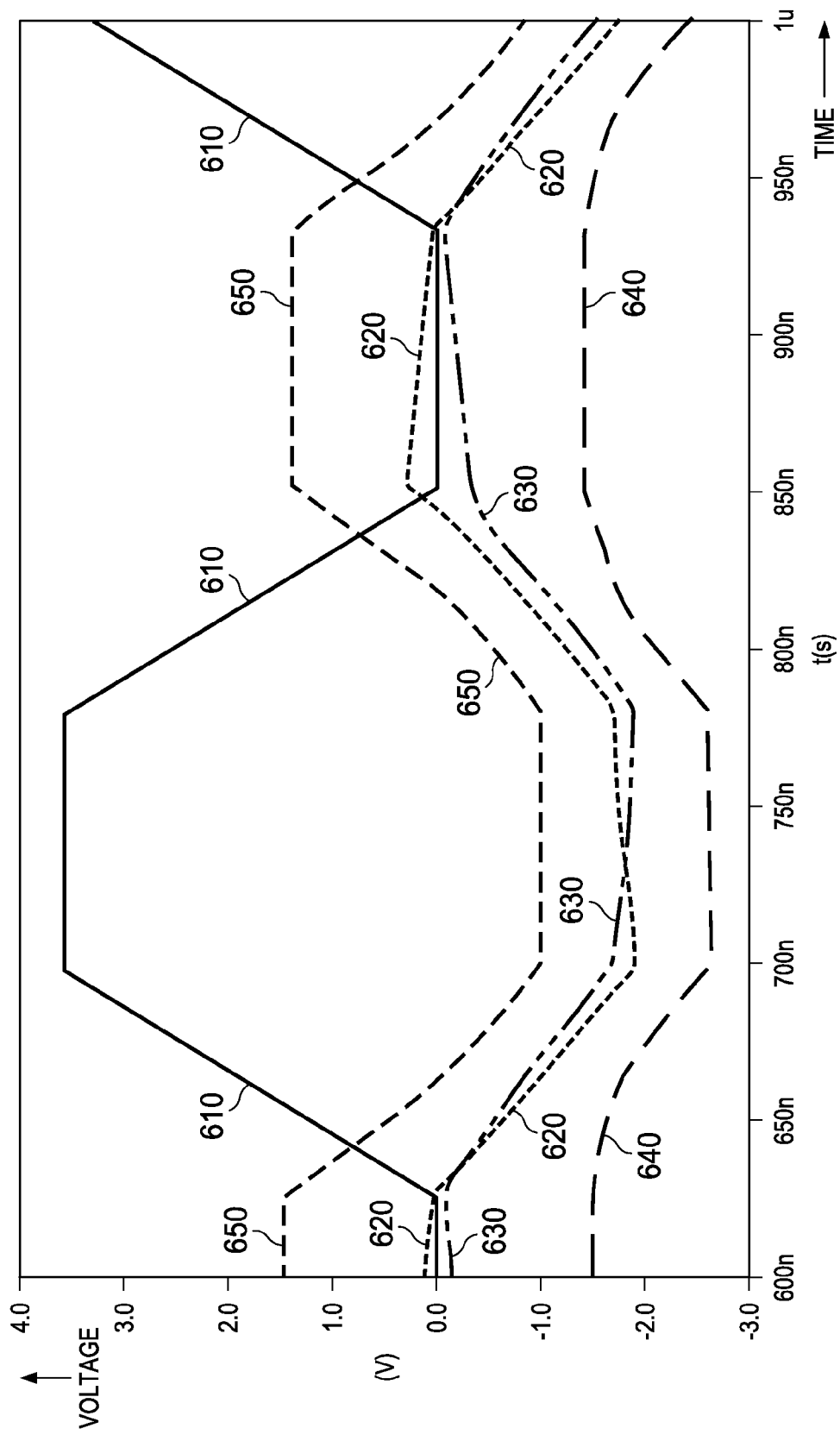
FIG. 6 illustrates a timing diagram comparing the operation of the IO circuit illustrated in FIG. 4 and the IO circuit illustrated in FIG. 5, according to an embodiment.

FIG. 6 illustrates a timing diagram comparing the operation of the IO circuit 420 and the IO circuit 520 in a receive mode. It is to be noted that all the values represented in the timing diagram of FIG. 6 and the corresponding description are according to an example embodiment for better understanding of the disclosure and are understood not to limit the scope of the present disclosure. Lines 610, 620, 630, 640 and 650 respectively represent voltage at the pad in the receive mode, voltage across the first capacitor C1 in IO circuit 520, voltage across the second capacitor C2 in IO circuit 520, voltage across the first capacitor C1 in IO circuit 420, and voltage across the second capacitor C2 in IO circuit 420. It is observed from the diagram that the voltage across the first capacitor C1 in IO circuit 420 (line 640) falls when the voltage at the pad transitions from logic-LOW to logic-HIGH in the receive mode (shown as transitioning from 0 volt to 3.5 volt). This fall in the voltage across the first capacitor may be beyond the specified limit and tends to overstress the first capacitor. Also, it is seen that the voltage across the second capacitor C2 in IO circuit 420 (line 650) falls when the pad transitions from logic-LOW to logic-HIGH in the receive mode. The node N which is between the first capacitor C1 and the second capacitor C2 in IO circuit 420 can have any voltage between the line 640 and line 650. This varying voltage at node N overstresses the first capacitor C1 or the second capacitor C2 in IO circuit 420. However, the voltage across the first capacitor C1 in IO circuit 520 (line 620) shows a less drop as compared to the first capacitor C1 in IO circuit 420 (line 640) when the pad transitions from logic-LOW to logic-HIGH in the receive mode. Similarly, the voltage across the second capacitor C2 in IO circuit 520 (line 630) shows a less drop as compared to the second capacitor C2 in IO circuit 420 (line 650) when the pad transitions from logic-LOW to logic-HIGH in the receive mode. As observed from the diagram, line 620 and line 630 are held at close voltage levels for all values of voltage at the pad. Thus, the voltage at node N in IO circuit 520 is maintained between lines 620 and 630. Therefore, the voltage at node N does not stress the first capacitor C1 and the second capacitor C2 in IO circuit 520.

Figure 7:
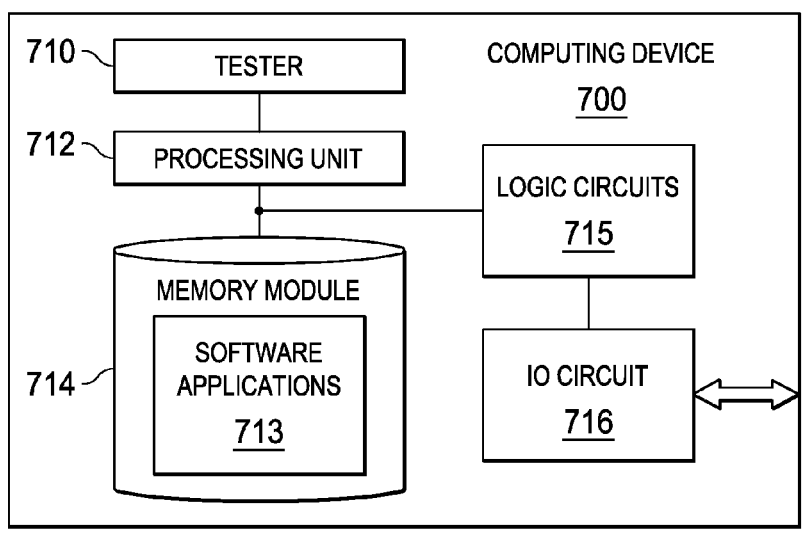
FIG. 7 illustrates a computing device according to an embodiment.

FIG. 7 illustrates a computing device 700 according to an embodiment. The computing device 700 is, or is an integrated circuit incorporated into, a mobile communication device, such as a mobile phone, a personal digital assistant, a personal computer, or any other type of electronic system.

In some embodiments, the computing device 700 can be one of, but not limited to, microcontroller, microprocessor or a system-on-chip (SoC) which includes a processing unit 712 such as a CPU (Central Processing Unit), a memory module 714 (e.g., random access memory (RAM)) and a tester 710. The processing unit 712 can be, for example, a CISC-type (Complex Instruction Set Computer) CPU, RISC-type CPU (Reduced Instruction Set Computer), or a digital signal processor (DSP). The memory module 714 (which can be memory such as RAM, flash memory, or disk storage) stores one or more software application 713 (e.g., embedded applications) that, when executed by the processing unit 712, perform any suitable function associated with the computing device 700. The tester 710 comprises logic that supports testing and debugging of the computing device 700 executing the software application 713. For example, the tester 710 can be used to emulate a defective or unavailable component(s) of the computing device 700 to allow verification of how the component(s), were it actually present on the computing device 700, would perform in various situations (e.g., how the component(s) would interact with the software application 713). In this way, the software application 713 can be debugged in an environment which resembles post-production operation.

The processing unit 712 comprises cache-memory and logic which store and use information frequently accessed from the memory module 714 and is responsible for the complete functionality of the computing device 700. The computing device 700 includes a plurality of logic circuits 715. At least one logic circuit of the plurality of logic circuits 715 is coupled to an IO circuit 716. The IO circuit 716 acts as an interface between the computing device 700 and the external world. The IO circuit 716 is analogous to the IO circuit 520 in connection and operation. The IO circuit 716 finds application in different devices especially devices working on high voltage signals and using low voltage devices. The IO circuit 716 provides an efficient slew rate control mechanism.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic-HIGH" is generally intended to describe a signal that is at logic state "1," and the term "logic-LOW" is generally intended to describe a signal that is at logic state "0." Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An input/output (IO) circuit comprising:
    a first bias circuit and a second bias circuit coupled to a node;
    a first capacitor and a second capacitor being cascaded, coupled to the node, the node being defined between the first capacitor and the second capacitor; and
    a pad coupled to the node; wherein the first bias circuit is configured to maintain a voltage at the node below a threshold during a transmit mode and a receive mode of the IO circuit and the second bias circuit is configured to maintain the voltage at the node below the threshold during the receive mode, wherein the voltage at the node is dependent on a voltage at the pad during the receive mode;
    a reference voltage generator configured to receive a supply voltage and configured to generate a set of reference voltages that are supplied to the first bias circuit, the second bias circuit and the driver circuit, the set of reference voltages comprises one of a PMOS reference voltage, an NMOS reference voltage and a divided supply voltage, wherein the first bias circuit comprises:
        a first PMOS transistor coupled to a first NMOS transistor configured to be driven by the divided supply voltage and the NMOS reference voltage respectively; and
        a second PMOS transistor coupled to a second NMOS transistor configured to be driven by the PMOS reference voltage and the divided supply voltage respectively, wherein the first NMOS transistor and the second PMOS transistor are coupled to the node.

2. The IO circuit of claim 1 further comprising a driver circuit coupled to the node.

3. The IO circuit of claim 1, wherein the second bias circuit comprises:
    a third PMOS transistor driven by the divided supply voltage, configured to be activated when the voltage at the node is above a first threshold voltage; and
    a third NMOS transistor coupled to the third PMOS transistor and configured to be driven by the voltage at the pad during receive mode, wherein the third NMOS transistor is configured to be activated when the voltage at the pad is above a second threshold voltage.

4. The IO circuit of claim 3, wherein the driver circuit comprises:
    a fourth NMOS transistor coupled to the node and configured to be activated when the voltage at the pad is above the second threshold voltage; and
    a fifth NMOS transistor coupled to the fourth NMOS transistor, wherein the fourth NMOS transistor and the fifth NMOS transistor having a common node of drains thereof coupled to a gate terminal of the third NMOS transistor.

5. The IO circuit of claim 4, wherein the third PMOS transistor is configured to be activated when the voltage at the node is above the first threshold voltage and the third NMOS transistor and the fourth NMOS transistor are configured to be activated when the voltage at the pad is above the second threshold voltage such that a discharge path is provided to the voltage at the node.

6. A method comprising:
    coupling a first capacitor and a second capacitor to a node, the node being defined between the first capacitor and the second capacitor, the first capacitor and the second capacitor being cascaded in an IO (input/output) circuit;
    configuring a first bias circuit to maintain a voltage at the node below a threshold during a transmit mode and a receive mode of the IO circuit; and
    configuring a second bias circuit to maintain the voltage at the node below the threshold during the receive mode, wherein the first bias circuit comprises:
        a first PMOS transistor coupled to a first NMOS transistor configured to be driven by the divided supply voltage and the NMOS reference voltage respectively; and
        a second PMOS transistor coupled to a second NMOS transistor configured to be driven by the PMOS reference voltage and the divided supply voltage respectively, wherein the first NMOS transistor and the second PMOS transistor are coupled to the node.

7. The method of claim 6 further comprising:
    activating the second bias circuit when a voltage at a pad is above a second threshold voltage and the voltage at the node is above a first threshold voltage; and
    activating a driver circuit coupled to the node when the voltage at the pad is above the second threshold voltage.

8. The method of claim 7, wherein the activating the second bias circuit comprises:
    activating a third PMOS transistor when the voltage at the node is above the first threshold voltage; and
    activating a third NMOS transistor when the voltage at the pad is above the second threshold voltage.

9. The method of claim 8, wherein activating the driver circuit comprises activating a fourth NMOS transistor when the voltage at the pad is above the second threshold voltage, wherein the fourth NMOS transistor and a fifth NMOS transistor having a common node of drains thereof coupled to a gate terminal of the third NMOS transistor.

10. The method of claim 7 further comprising generating a set of reference voltages from a supply voltage, wherein the set of reference voltages are provided to the first bias circuit, second bias circuit and the driver circuit.

11. The method of claim 10, wherein generating a set of reference voltages further comprises generating at least one of a PMOS reference voltage, an NMOS reference voltage and a divided supply voltage.

12. The method of claim 6 further comprising driving the third PMOS transistor by the divided supply voltage and driving the fourth NMOS transistor by the NMOS reference voltage.

13. A computing device comprising:
    a processing unit;
    a memory module coupled to the processing unit;

a plurality of logic circuits coupled to the processing unit and the memory module; and an input/output (IO) circuit coupled to atleast one logic circuit, the IO circuit comprising:
   a first bias circuit and a second bias circuit coupled to a node;
   a first capacitor and a second capacitor being cascaded, coupled to the node, the node being defined between the first capacitor and the second capacitor;
   a driver circuit coupled to the node; and
   a pad coupled to the node, wherein the first bias circuit is configured to maintain a voltage at the node below a threshold during a transmit mode and a receive mode of the IO circuit and the second bias circuit is configured to maintain the voltage at the node below the threshold during the receive mode, wherein the voltage at the node is dependent on a voltage at the pad during the receive mode.

14. The computing device of claim 13 further comprising a reference voltage generator configured to receive a supply voltage and configured to generate a set of reference voltages that are supplied to the first bias circuit, second bias circuit and the driver circuit, wherein the set of reference voltages comprises one of a PMOS reference voltage, an NMOS reference voltage and a divided supply voltage.

15. The computing device of claim 13, wherein the first bias circuit comprises:
   a first PMOS transistor coupled to a first NMOS transistor configured to be driven by the divided supply voltage and the NMOS reference voltage respectively; and
   a second PMOS transistor coupled to a second NMOS transistor configured to be driven by the PMOS reference voltage and the divided supply voltage respectively, wherein the first NMOS transistor and the second PMOS transistor are coupled to the node.

16. The computing device of claim 13, wherein the second bias circuit comprises:
   a third PMOS transistor driven by the divided supply voltage, configured to be activated when the voltage at the node is above a first threshold voltage; and
   a third NMOS transistor coupled to the third PMOS transistor and configured to be driven by the voltage at the pad during receive mode of the IO circuit, wherein the third NMOS transistor is configured to be activated when the voltage at the pad is above a second threshold voltage.

17. The computing device of claim 13, wherein the driver circuit comprises:
   a fourth NMOS transistor coupled to the node and configured to be activated when the voltage at the pad is above the second threshold voltage; and
   a fifth NMOS transistor coupled to the fourth NMOS transistor, wherein the fourth NMOS transistor and the fifth NMOS transistor having a common node of drains thereof coupled to a gate terminal of the third NMOS transistor.

18. The computing device of claim 13, wherein the third PMOS transistor is activated when the voltage at the node is above the first threshold voltage and the third NMOS transistor and the fourth NMOS transistor are configured to be activated when the voltage at the pad is above the second threshold voltage such that a discharge path is provided to the voltage at the node.

* * * * *